United States Patent [19]
Pritchett

[11] Patent Number: 5,311,148
[45] Date of Patent: May 10, 1994

[54] THERMALLY OPTIMIZED INTERDIGITATED TRANSISTOR

[75] Inventor: Samuel D. Pritchett, Flower Mound, Tex.

[73] Assignee: Texas Instruments Incorporated, Dallas, Tex.

[21] Appl. No.: 4,373

[22] Filed: Jan. 14, 1993

Related U.S. Application Data

[60] Division of Ser. No. 608,119, Nov. 1, 1990, Pat. No. 5,210,596, which is a continuation of Ser. No. 374,422, Jun. 30, 1989, abandoned.

[51] Int. Cl.$^5$ .............................................. H03F 3/14
[52] U.S. Cl. ...................................... 330/295; 330/307
[58] Field of Search ................ 330/277, 286, 295, 307

[56] References Cited

U.S. PATENT DOCUMENTS 4,429,286  1/1984  Nichols et al. ...................... 330/286

*Primary Examiner*—Steven Mottola
*Attorney, Agent, or Firm*—René E. Grossman; Richard L. Donaldson

[57] ABSTRACT

A quasi-interdigitated transistor (50) for rf power applications has a plurality of channel regions (102-118) that are each offset from each other in a y-direction such that a $\bar{q}_x$ heating component from adjacent channel regions will affect any one channel region to a lesser extent that the $\bar{q}_x$ from adjacent channel regions in the conventional interdigitated structure. In a preferred embodiment, the channel regions (102-118) are formed in a single, curved, V-shaped row such that the cumulative transverse width of all of the transistor sections is less than the waveguide cutoff frequency. The V-shaped row of transistor sections also provides the advantage of parallel signal paths having approximately the same propagation time delay such that there is no phase cancellation within the device.

20 Claims, 2 Drawing Sheets

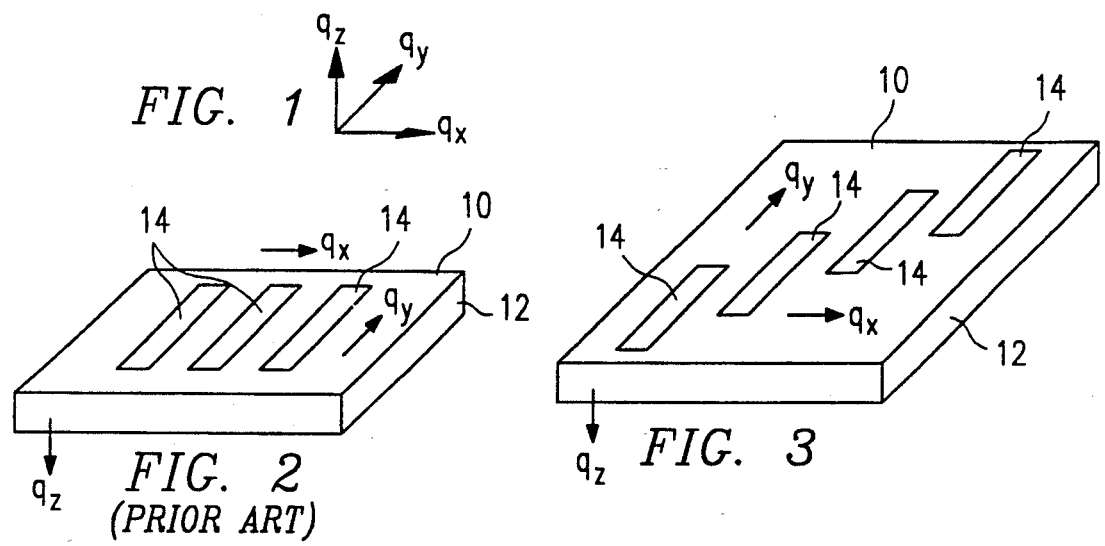
FIG. 1
FIG. 2 (PRIOR ART)
FIG. 3
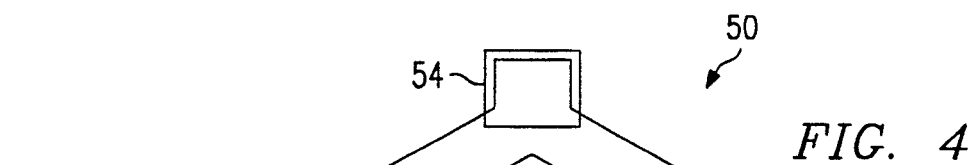
FIG. 4

THERMALLY OPTIMIZED INTERDIGITATED TRANSISTOR

RELATED APPLICATIONS

This is a division of application Ser. No. 07/608,119, filed Nov. 1, 1990, which is a continuation of application Ser. No. 07/374,422 filed Jun. 30, 1989, now abandoned.

TECHNICAL FIELD OF THE INVENTION

The present invention relates to the thermal optimization of transistors, and more particularly to a thermally optimized quasi-interdigitated radio frequency power transistor.

BACKGROUND OF THE INVENTION

Solid-state power amplifiers have received considerable attention since the invention of the solid-state transistor and the solid-state integrated circuit. Heat is generated in the active regions of field effect transistors (FETs) and bipolar junction transistors (BJTs) as a result of $I^2R$ losses. This heat affects the reliability and thus the mean time before failure (MTBF) of these transistors. Fourier's law of heat conduction describes the spatial flow of heat through a substance by the following one-dimensional expression:

$$q = k \frac{dt}{dx} \quad (1)$$

where q, the heat flux, is a heat rate per unit area; k is the thermal conductivity of the conducting medium; T is the temperature; and d/dx is the differential with respect to distance. The more general form is the vector expression:

$$q = -k \nabla t \quad (2)$$

where overstruck quantities represent vector quantities and the symbol $\nabla$ represents divergence.

The semiconductor chip in which a solid-state power amplifier is built is typically mounted on a metal or composite material having a thermal conductivity that is at least two times greater than the thermal conductivity of the semiconductor, $k_{semi}$. As a result, $k_{semi}$ is generally the limiting component in heat dissipation from the power amplifier.

The thermal conductivity of the semiconductor, $k_{semi}$, is a function of temperature. For temperatures above approximately 20K, $k_{semi}$ can be expressed by the following relation:

$$k_{semi} = k_0 \frac{T_0}{T} \quad (3)$$

where $k_o$ is the thermal conductivity of the conducting medium at the reference temperature, $T_o$ is the reference temperature, and T is the temperature of the conducting medium. The reference temperature, $T_o$, is generally room temperature or, in degrees Kelvin, approximately 300K. For pure silicon (Si) and gallium arsenide (GaAs), the values for $k_o$ are $1.45 \pm 0.05$ and $0.44 \pm 0.04$ W/cm-K, respectively.

When semiconductor impurity (i.e. dopant) concentrations exceed $10^{15}$ atoms/cm$^3$, the thermal conductivity of the conducting medium is reduced. This results from photon-electron scattering. In typical semiconductor devices, $k_{semi}$ will not degrade more than approximately 20% due to semiconductor impurities.

Reliability studies indicate that the active temperature for semiconductor regions, $T_{active}$, should not exceed about 150° C. Ambient operating temperatures of any semiconductors are approximately 85° C. Because of these limitations, the density of rf power generated by a power amplifier transistor must be maintained below a predetermined threshold, $P_{Dmax}$, to maintain an acceptable operating temperatures and therefore MTBF.

Conventionally, rf power density has been increased while minimizing the overall chip width W by interdigitating small transistor sections or heat-generating regions. These transistor sections are placed as close as possible to each other while maintaining $T_{active}$ below an acceptable value during device operation.

In high-frequency applications, another problem arises. As the width of the cavity (approximately equal to the chip width, W) in which the transistor is mounted, increases, waveguide resonating modes become possible. These modes effectively feed back a portion of the rf energy to the input of the transistor. This increases the loss of the circuit and can also cause unwanted transistor oscillations. Waveguide resonating modes are strongly attenuated when the width of the cavity is less than half of the effective wavelength, $\lambda/2$ at the frequency of device operation.

A problem inherent in these conventional interdigitating transistor structures is that adjacent transistor sections contribute significantly to the heat dissipation required by neighboring transistor sections. As a result of demands for increased rf power in system applications at higher and higher frequencies, the standard interdigitated transistor structure is no longer sufficient.

Another conventional approach is to use thinner semiconductor substrates. This increases the dT/dz, where z is in the direction of the substrates thickness, and causes increased heat transfer. However, in many integrated circuit applications, such as monolithic microwave integrated circuits, certain other components such as distributed transmission lines fix lower limits on substrate thickness.

From the above, it can be seen that a need has arisen for a high-frequency rf power transistor having acceptable heat dissipation while being capable of generating increased rf power within fixed physical dimensions.

SUMMARY OF THE INVENTION

According to one aspect of the invention, an interdigitated transistor is provided that is formed at a face of a semiconductor layer. A plurality of subtransistors are formed at the face which have inputs connected in common and outputs connected in common, each subtransistor having a heat-generating region which generates heat during operation of the transistor. The heat-generating regions are disposed in a single row in an x-direction, but are offset from adjacent heat-generating regions in a y-direction. Therefore, the heat from each heat-generating regions will dissipate by at least a predetermined desired amount independently from adjacent heat-generating regions, keeping the $T_{active}$ of the transistor within acceptable operating limits.

According to another aspect of the invention, each heat generating region, which for example may be a channel region of a field effect transistor, has a center positioned on a V-shaped line such that more transistors including these sections may be fit within a predetermined cavity dimension (w) in the transverse direction that is less than half of the effective operating wavelength, thereby avoiding waveguide resonating mode problems. Another technical advantage of the invention is that the V-shaped arrangement of the channel regions with respect to one another can be outwardly curved. The transverse spacing between adjacent channel regions and the ends of the "V" are set at a predetermined distance to meet each region's dissipation requirements. As each branch of the "V" curves inwardly to a longitudinal axis of the transistor, the transverse spacing between adjacent channel sections can be decreased because of the increased offset.

The V-shaped arrangement provides another technical advantage in that it provides an anti-symmetric combination of the signal from the various signal paths. Therefore, there is little or no phase cancellation experienced within the device and accordingly no loss of power for this reason as is usually experienced in conventional interdigitated transistors.

In a preferred embodiment of the invention, the power transistor is a junction field effect transistor. A drain contact and a gate contact are positioned on a longitudinal axis. A pair of gate manifolds extend from the gate contact longitudinally toward the drain contact and transversely outward from the longitudinal axis. A plurality of channel regions are formed between the gate manifolds and the drain contact on the "V" shaped pattern as described above. Each of the gate regions has its electrical conductance controlled by a respective gate electrode that is conductively coupled to one of the gate manifolds.

Each of the channel regions has associated with it a drain region that is preferably formed as a diffused finger that extends from the drain contact. For each channel region there is further a source regions that is electrically coupled to one of two source contacts through a metal air bridge over one of the gate manifolds.

The present invention provides significant technical advantages in that it affords a transistor design having a width or transverse dimension that is less smaller, but which at the same time increases the heat dissipation ability of the transistor while in operation and avoids losses due to phase cancellation from multiple parallel signal paths. The transistor of the invention may therefore be operated at high power and higher rf frequencies, and more of the transistors may be fit onto a chip having a width w that is less than $\lambda/2$.

BRIEF DESCRIPTION OF THE DRAWINGS

Further aspects of the invention and their advantages may be discerned by referring to the following detailed description when taken in conjunction with the drawing, in which:

FIG. 1 is a schematic diagram of a three-dimensional coordinate system useful for explaining the invention;

FIG. 2 is a highly schematic isometric view of an interdigitated transistor according to the prior art;

FIG. 3 is a highly schematic isometric view of a quasi-interdigitated transistor according to the invention, illustrating advantages in heat dissipation;

FIG. 4 is a highly magnified, schematic plan view of a microwave signal power amplifier transistor as incorporating the invention.

DETAILED DESCRIPTION OF THE INVENTION

Figure 5:
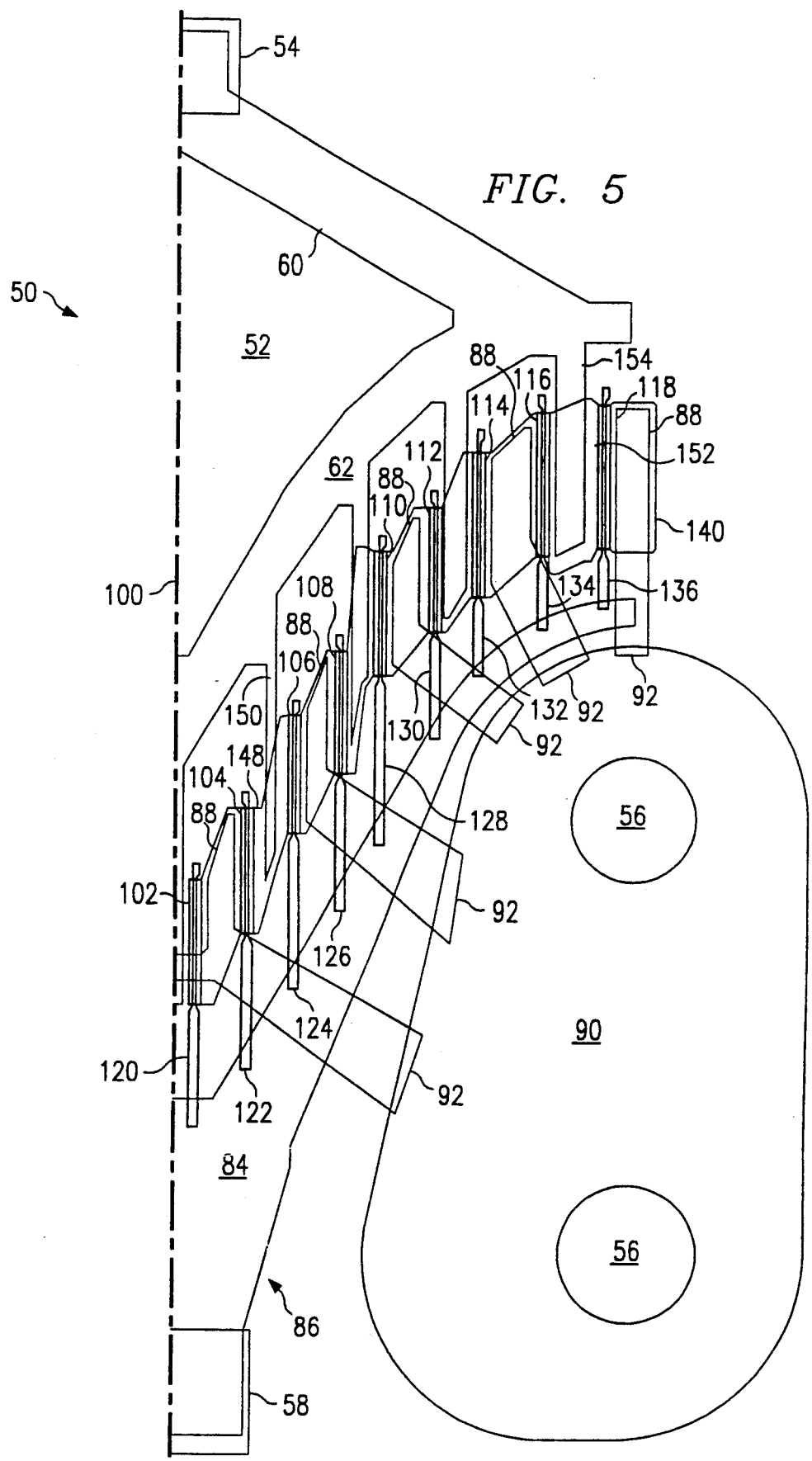
FIG. 5 is a more detailed view of one half of the transistor illustrated in FIG. 4.

From any point of a heat-generating region in a semiconductor device such as a power transistor, heat dissipation may be resolved into three vector components: x, y and z, corresponding to the axes of a typical three-dimensional coordinate system as shown in FIG. 1.

FIG. 2 is a highly schematic isometric view of an interdigitated transistor according to the prior art. According to conventional practice, the transistor is formed at a face 10 of a semiconductor substrate or bulk semiconductor 12. The substrate 12 generally has a thickness in the z-direction that is much less than its length or width in the y or x-directions, respectively. The transistor comprises a plurality of heat-generating sections 14, which in the case of field-effect transistors are the channel regions disposed between neighboring source and drain regions (not shown). The principle of the invention is also applicable to bipolar devices, wherein the heat generating regions 14 would comprise entire bipolar devices.

In operation, each of the heat-generating regions 14 will originate heat that is transferred in the x-, y- and z-directions. The vectors labeled $q_x$, $q_y$, and $q_z$ represent the heat transfer in these appropriate directions.

The temperature differential in the z-direction, $dT/dz$, is greater than the temperature differential in the x- and y-directions, $dT/dx$ and $dT/dy$, respectively, This results from the thermal conductivity of the metal or composite material (not shown) on which the semiconductor chip 12 is mounted. For the purpose of analyzing heat transfer, the thermal conductivity of the metal or composite mounting material may be considered infinite and at a constant temperature, $T_{sink}$.

Provided that the thickness z of the semiconductor substrate 12 and $T_{active}$ are fixed, the only possible way to reduce the spacing between adjacent transistor heat-generating sections 14 is to reduce the contribution of $q_x$ from neighboring transistor sections.

Referring now to FIG. 3, a highly schematic isometric view of a quasi-interdigitated transistor according to the invention is shown. Like numbers identify like parts between FIGS. 2 and 3. As can be seen, the position of adjacent transistor sections 14 is shifted in the y-direction to reduce the contribution of $q_x$ from neighboring transistor sections 14. The partial removal of the $q_x$ component of heat from adjacent transistor sections 14 allows the interdigitated transistor to dissipate heat more efficiently, assuming all other factors to be the same, and therefore the transistor may be operated at a higher power and at lower or equal $T_{active}$.

The offset of the individual transistor sections 14 in the y-direction can be realized in actual devices in several fashions. An example of one possible realization is illustrated in FIGS. 4 and 5. FIG. 5 is a highly magnified schematic plan view of a quasiinterdigitated transistor for use in microwave power applications. This transistor is indicated generally at 50, and is formed at a face of a semiconductor substrate 52. Only certain components of transistor 50 are shown in FIG. 4 for the sake of clarity.

Transistor 50 is a metal semiconductor field effect transistor (MESFET). A drain contact is indicated at 54. Connection is made to other amplifier components through the drain contact 54, a plurality of source vias 56 and a gate contact 58. Each of these contacts is made through a passivating dielectric layer (not shown) to the face of the semiconductor substrate 52.

The drain contact 54 is conductively connected to a metallized drain manifold, the outline of which is indicated at 60. In the illustrated embodiment, the drain manifold 60 takes a hollow diamond-shaped pattern, and includes a pair of lower arms 62. A plurality of metallized drain contact fingers 64 extends from the lower drain manifold arm 62 longitudinally in the direction of the gate contact 58. Each of the drain contact fingers 64 makes connection to a respective drain region (not shown; see FIG. 5) that is diffused into the semiconductor layer 52.

The transistor 50 is provided with a plurality of channel regions 80. The channel regions 80 are the source of most of the heat generated during operation of the transistor 50, such that their locations may dictate the modelling of the entire device 50. Each of the channel regions 80, where for instance the substrate 52 is gallium arsenide, is an elongate rectangle of (N) type material between a respective drain region and a respective source regions (both later described), with the length of each channel region 80 in a longitudinal or y-direction being much greater than its width in a transverse or x-direction. (In FIG. 4, y is in a vertical direction, while x is in the horizontal direction).

Each of the rectangular channel regions 80 is offset in a y-direction from the adjacent channel regions 80. Each of the channel regions 80 is connected through a metal conductor shown schematically at 82 to one of two metal arms 84 of a gate manifold indicated generally at 86. The gate manifold 86 is in turn connected to the gate contact 58.

Disposed on one side of each of the channel regions 80 is a respective source region 88 (not shown; see FIG. 5). Each source region 88 is diffused into the semiconductor substrate 52 to be (N+), where the drain regions are also selected to be (N+). Each source, region 88 is connected to one of two metal source contact pads 90 through a respective conductive air bridge 92 that is insulatively separated from the gate manifold arm 84 over which it passes by both a dielectric passivating layer (not shown) and air.

A longitudinal one-half of the transistor 50 is shown in more detail in FIG. 5. The y axis is indicated at 100, and only the right one-half of the transistor 50 is shown. Channel regions 102-118 are not offset by a constant amount as one proceeds transversely from the y axis 100. Instead, the longitudinal centers of the channel regions 102-118 fall on a curved V-shaped locus that extends from the y axis 100 in a longitudinal direction toward the drain contact 54, while progressively curving transversely. More inwardly disposed channel regions 102-108 are offset from each other in y-direction by a fairly constant amount. The incremental offset of the more outer channel regions 110-118 form each other, and from channel region 108, begins to decrease as one proceeds in a transverse direction from the y-axis 100. This arcuate or serpentine positioning was optimized using a thermal modelling program incorporating a finite difference technique.

Each of the channel regions 102-118 has a corresponding gate electrode 120-136 that is bonded directly to the surface of its respective channel region 102-118. To improve Schottky junction breakdown, each gate electrode 120-136 is recessed into the face of the semiconductor substrate 52. While each channel region is associated with only one gate electrode in the illustrated embodiment, the invention also applies to channel regions having multiple electrodes.

The separation of the channel regions 102-118 in an x or transverse direction increases as one proceeds from the y-axis. This is because there is more y-offset between adjacent channel regions near the axis 100, and relatively less y-offset of adjacent channel regions further from the axis 100. Because of this, the heat component $\bar{q}_x$ from any channel region adjacent to a channel region that is relatively removed from the axis 100 becomes a greater concern, and a further transverse spacing is required in comparison to those channel regions nearer the axis 100.

The illustrated transistor 50 is preferably formed on a chip with several other like transistors in a single row in the x-direction. The chip width w must be kept less than the waveguide cutoff frequency, $\lambda/2$, to prevent waveguide resonating modes and feedback of a portion of the rf energy to the inputs of the transistor 50. The arcuate V design of the transistor of the invention allows a sufficiently close spacing of adjacent channel regions 102-118 such that a smaller w becomes possible for any particular power application. Meanwhile, thermal optimization has insured a constant channel or junction temperature $T_{active}$ is maintained throughout all of the channel regions 102-118.

Another advantage of the invention is it anti-symmetric combining structure. The signal appears at the gate contact 58, and is amplified by the various transistor sections to appear at the drain contact 54 through a plurality of multiple parallel paths. Each one of these multiple parallel paths has a propagation time delay associated with it. For example, in one path, the signal proceeds from the gate contact 58 to the gate manifold 86 and starts up the gate manifold arm 84. It proceeds up a gate conductor 122, where it is amplified with current supplied from a channel region 104. The amplified signal continues through drain region 148, and travels through an associated drain contact finger 150 to the drain contact arm 62 and from thence to the drain contact 54.

In another parallel path, the signal proceeds all the way up the gate contact manifold arm 84 to a gate conductor 118. The signal as amplified continues through at a drain region 152 and proceeds from thence to a drain finger 154 to the drain manifold 60 and the drain contact 54. These two parallel paths, and various other signal paths in between, experience approximately the same time delay, since as the length from the gate contact 58 to a particular channel region 102-118 increases, the length from an associated drain region to the drain contact 54 decreases. Hence, there will be no signal phase cancellation within the device due to different time propagation delays experienced by multiple parallel paths.

In summary, a novel quasi-interdigitated transistor has been described, wherein multiple channel regions are offset from one another in reference to a particular axis to remove a portion of the heating experienced by adjacent channel regions. The transistor has been modelled to maintain a uniform $T_{active}$ for each channel region in the device, while at the same time having a transverse dimension that is less than the waveguide cutoff frequency. The transistor of the invention has the further advantage of equal time propagation delays associated with multiple signal paths.

While a preferred embodiment and its advantages have been described in the above detail description, the invention is not limited thereto but only by the spirit and scope of the appended claims.

What is claimed is:

1. A method of transmitting a high frequency signal comprising the steps of:
   (a) providing an active semiconductor device having a plurality of active semiconductor element sections, each of said element sections having a heat producing region, a small input region and an output region, adjacent ones of said element sections being spaced apart in a first direction and offset in a second direction substantially perpendicular to said first direction, the magnitude of the offset being preselected as a function of said spacing;
   (b) coupling a single high frequency signal to said input regions of each of said active semiconductor element sections;
   (c) altering said high frequency signal in each of said active semiconductor element sections; and
   (d) coupling together said output regions of each of said active semiconductor element sections such that the active semiconductor element sections operate as a plurality of parallel components and sum the output of each of said active semiconductor element regions in-phase at said coupled together output regions.

2. The method of claim 1 and further comprising the step of preselecting the spacing of the adjacent ones of said active semiconductor element sections such that the time propagation delay of a high frequency signal from said signal input region to said output region through each of said active semiconductor element sections is substantially the same.

3. The method of claim 1 wherein said active semiconductor device is an amplifier and said step of altering is the step of amplifying.

4. The method of claim 2 wherein said active semiconductor device is an amplifier and said step of altering is the step of amplifying.

5. The method of claim 1 wherein said heat producing region of each of said active semiconductor element sections has a longest dimension, further including the step of positioning each of said active semiconductor element sections so that all of said longest dimensions are positioned substantially in parallel.

6. The method of claim 2 wherein said heat producing region of each of said active semiconductor element sections has a longest dimension, further including the step of positioning each of said active semiconductor element sections so that all of said longest dimensions are positioned substantially in parallel.

7. The method of claim 3 wherein said heat producing region of each of said active semiconductor element sections has a longest dimension, further including the step of positioning each of said active semiconductor element sections so that all of said longest dimensions are positioned substantially in parallel.

8. The method of claim 4 wherein said heat producing region of each of said active semiconductor element sections has a longest dimension, further including the step of positioning each of said active semiconductor element sections so that all of said longest dimensions are positioned substantially in parallel.

9. A method of transmitting a high frequency signal comprising the steps of:
   (a) providing a semiconductor substrate;
   (b) forming in said substrate a plurality of active semiconductor elements, each of said elements having an input terminal, an output terminal and a heat producing region having a longest dimension, adjacent ones of said elements being spaced apart in a first direction and offset in a second direction perpendicular to said first direction, the magnitude of said offset being preselected as a function of said spacing; and
   (c) coupling together each of said input terminals and coupling together each of said output terminals.

10. The method of claim 9, further comprising the step of preselecting the spacing of the adjacent ones of said active semiconductor elements such that the time propagation delay of a high frequency signal from said input terminal to said output terminal through each of said active semiconductor elements is substantially the same.

11. The method of claim 9 wherein said active semiconductor device is an amplifier.

12. The method of claim 10 wherein said active semiconductor device is an amplifier.

13. The method of claim 9, further including the step of positioning each of said active semiconductor elements in said semiconductor substrate so that all of said longest dimensions are positioned substantially in parallel.

14. The method of claim 10, further including the step of positioning each of said active semiconductor elements in said semiconductor substrate so that all of said longest dimensions are positioned substantially in parallel.

15. The method of claim 11, further including the step of positioning each of said active semiconductor elements in said semiconductor substrate so that all of said longest dimensions are positioned substantially in parallel.

16. The method of claim 12, further including the step of positioning each of said active semiconductor elements in said semiconductor substrate so that all of said longest dimensions are positioned substantially in parallel.

17. The method of claim 1 wherein said offset is in the shape of a "V".

18. The method of claim 8 wherein said offset is in the shape of a "V".

19. The method of claim 9 wherein said offset is in the shape of a "V".

20. The method of claim 16 wherein said offset is in the shape of a "V".

* * * * *